(12) United States Patent
Kawauchi

(10) Patent No.: US 7,677,944 B2
(45) Date of Patent: Mar. 16, 2010

(54) ORGANIC EL DEVICE MANUFACTURING METHOD AND ORGANIC EL DEVICE

(75) Inventor: Hiroyasu Kawauchi, Aichi-ken (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 805 days.

(21) Appl. No.: 11/517,988

(22) Filed: Sep. 7, 2006

(65) Prior Publication Data

US 2007/0052356 A1 Mar. 8, 2007

(30) Foreign Application Priority Data

Sep. 7, 2005 (JP) ............................. 2005-259193

(51) Int. Cl.
*H01J 9/24* (2006.01)
*H01J 9/26* (2006.01)
(52) U.S. Cl. ..................... 445/25; 313/504; 313/512
(58) Field of Classification Search ................ 313/504, 313/506, 512; 445/24, 25
See application file for complete search history.

(56) References Cited

U.S. PATENT DOCUMENTS 7,521,861 B2 * 4/2009 Kawauchi et al. ........... 313/506

FOREIGN PATENT DOCUMENTS

| JP | 10-284254 | 10/1998 |
|---|---|---|
| JP | 2000-040594 | 2/2000 |

\* cited by examiner

*Primary Examiner*—Karabi Guharay
(74) *Attorney, Agent, or Firm*—Locke Lord Bissell & Liddell LLP

(57) ABSTRACT

A transparent substrate on which a transparent electrode layer is formed is prepared. An insulating layer having a first pattern for exposing a light-emitting region and a first terminal portion and covering a second terminal portion is formed on the transparent electrode layer. Then, an organic layer is formed on the entire surface of the transparent electrode layer and the insulating layer. A reflection electrode layer having a second pattern for covering the light-emitting region and the second terminal portion and exposing the first terminal portion is formed on the organic layer. After that, an exposed portion of the organic layer is removed by dry etching to expose a region of the first electrode layer in the first terminal portion. Finally, a sealing film having a third pattern for covering the light-emitting region and exposing the first terminal portion and the second terminal portion is formed on the resultant transparent substrate, thereby exposing the first terminal portion and the second terminal portion.

11 Claims, 4 Drawing Sheets

ORGANIC EL DEVICE MANUFACTURING METHOD AND ORGANIC EL DEVICE

BACKGROUND OF THE INVENTION

1. Field of the Invention

The present invention relates to an organic electroluminescence (EL) device manufacturing method. In addition, the present invention relates to an organic EL device.

2. Description of the Related Art

Up to now, an organic EL device can perform self-light emission to obtain a high luminance screen. Therefore, the organic EL device has been widely put into practical use as a display or an illuminating device, which is used for, for example, a mobile device which is small in thickness and light in weight.

The organic EL device has such a fundamental structure that an organic light-emitting layer is provided between an anode and a cathode. In order to emit light from the organic EL device having such the structure, it is necessary for a first terminal portion and a second terminal portion to extend from the anode and the cathode to the outside of a light-emitting region to establish a connection with a drive power source, thereby supplying a current to an organic EL layer of the light-emitting region.

An example of the method of manufacturing the organic EL device described above involves stacking an anode, an organic layer, and a cathode on a substrate in this order using a mask having a predetermined pattern formed thereon. When the mask is used, alignment between the substrate and the mask is performed before the formation of the respective layers. When a positional displacement of the mask occurs, a high-quality organic EL device cannot be manufactured. Therefore, the alignment of the mask is slowly and carefully performed.

Another example of the method of manufacturing the organic EL device involves stacking a first electrode, an organic EL layer, and a second electrode on a transparent substrate in this order, providing a damage prevention film on the second electrode, and forming a resist pattern on the damage prevention film to perform etching, thereby obtaining the organic EL device having a light-emitting region, which is disclosed in JP 2000-040594 A.

However, in the case of the method of forming every layer composing the organic EL device using the mask to manufacture the organic EL device, for example, when the organic layer is a multilayer, it is necessary to perform the alignment between the mask and the substrate plural times. Therefore, manufacturing the organic EL device takes time.

JP 2000-040594 A does not disclose a method of forming the first terminal portion, the second terminal portion, and the like. In JP 2000-040594 A, etching using a resist as the mask is performed to form a pattern of the light-emitting region. It is likely to damage the organic EL layer by a wet process performed for forming the pattern of the resist.

SUMMARY OF THE INVENTION

The present invention has been made to solve the above-mentioned problems. An object of the present invention is to provide a manufacturing method capable of easily manufacturing an organic EL device including a light-emitting region, a first terminal portion, and a second terminal portion, and the organic EL device including the light-emitting region, the first terminal portion, and the second terminal portion.

According to the present invention, a method of manufacturing an organic EL device including the light-emitting region, the first terminal portion, and the second terminal portion, includes: preparing a substrate on which a first electrode layer is formed; forming, on the first electrode layer, an insulating layer having a first pattern for covering the second terminal portion and exposing the light-emitting region and the first terminal portion; forming an organic layer above an entire surface of the substrate on which the first electrode layer and the insulating layer are formed; forming, on the organic layer, a second electrode layer having a second pattern for covering the light-emitting region and the second terminal portion and exposing the first terminal portion; removing a region of the organic layer on which the second electrode layer is not formed to expose a region of the first electrode layer in the first terminal portion; and forming, on the second electrode layer, a sealing film having a third pattern for covering the light-emitting region and exposing the first terminal portion and the second terminal portion.

According to the present invention, an organic EL device having a first electrode layer, an organic layer, a second electrode layer, and a sealing film stacked on a substrate in the stated order, includes a light-emitting region, a first terminal portion, and a second terminal portion, wherein an insulating layer has a first pattern for covering the second terminal portion and exposing the light-emitting region and the first terminal portion, the insulating layer being formed between the first electrode layer and the organic layer, the first terminal portion having a structure in which the first electrode layer is formed on the substrate and the first electrode layer is exposed, the second terminal portion having a structure in which the first electrode layer, the insulating layer, the organic layer, the second electrode layer are stacked on the substrate in the stated order and the second electrode layer is exposed.

DETAILED DESCRIPTION OF THE PREFERRED EMBODIMENTS

Hereinafter, embodiments of the present invention will be described with reference to the accompanying drawings.

First Embodiment

Figure 1:
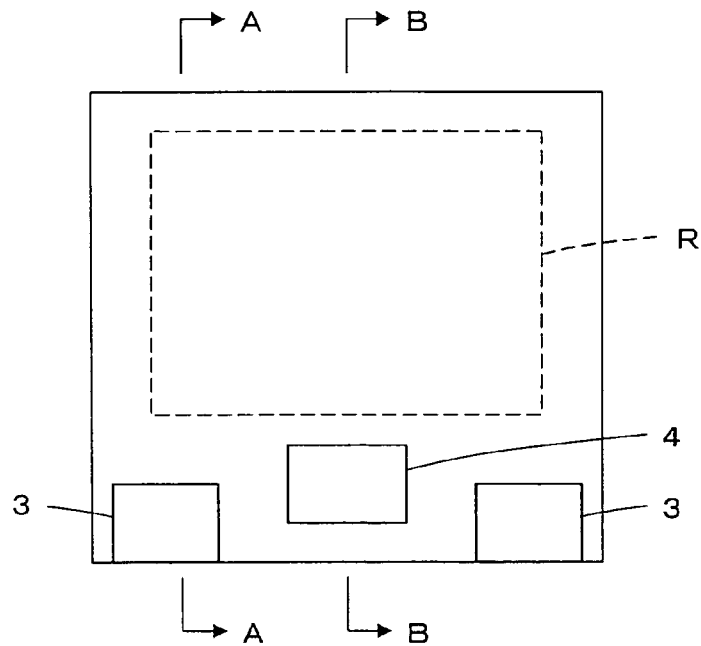
FIG. 1 is a plan view showing an organic EL device according to a first embodiment of the present invention.

FIG. 1 is a plan view showing an organic electroluminescence (EL) device according to a first embodiment of the present invention. The organic EL device includes a rectangular light-emitting region R, two first terminal portions 3 and a second terminal portion 4. The first terminal portions 3 and the second terminal portion 4 are located adjacent to the light-emitting region R.

Figure 2A:
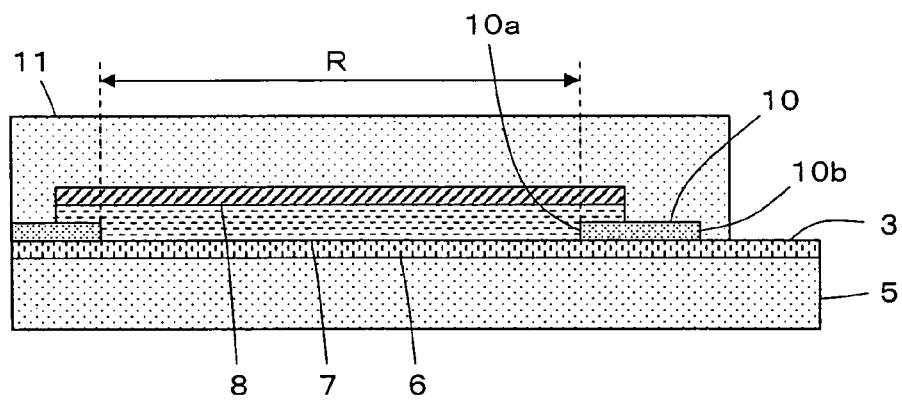
FIGS. 2A and 2B are cross sectional views taken along the A-A line and the B-B line of FIG. 1, respectively.
Figure 2B:
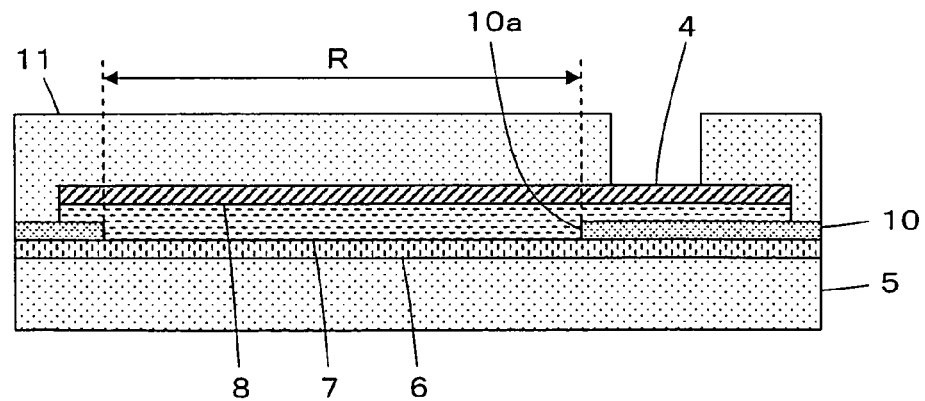

FIG. 2A is a cross sectional view along an A-A line shown in FIG. 1 and FIG. 2B is a cross sectional view along a B-B line shown in FIG. 1. As shown in FIG. 2A, a transparent electrode layer 6 serving as a first electrode layer is located on a surface of a transparent substrate 5. An organic layer 7 including a light-emitting layer is located on the transparent electrode layer 6. A reflection electrode layer 8 serving as a second electrode layer is located on the organic layer 7. An insulating layer 10 having an opening portion 10a for defining the light-emitting region R of the organic EL device and cutting portions 10b for defining the first terminal portions 3 is located on the transparent electrode layer 6. A sealing film 11 is formed on the substantially entire surface of the transparent substrate 5 over the reflection electrode layer 8. In the first embodiment of the present invention, the transparent electrode layer 6 composes an anode and the reflection electrode layer 8 composes a cathode.

In this embodiment, the light-emitting region R of the organic EL device is formed of four layers, that is, the transparent electrode layer 6, the organic layer 7, the reflection electrode layer 8, and a sealing film 11, which are directly stacked on one another in this order inside the opening portion 10a of the insulating layer 10. The transparent electrode layer 6 has a portion exposed through the cutting portion 10b of the insulating layer 10, and this portion is used as the first terminal portion 3. As shown in FIG. 2B, the reflection electrode layer 8 has a portion exposed without being covered with the sealing film 11, and this portion is used as the second terminal portion 4.

The transparent substrate 5 may be made of a material transparent to light to be extracted. A glass, a resin, or the like can be used as such a material. The transparent electrode layer 6 only needs to serve as an electrode and be transparent to at least light to be extracted. For example, indium tin oxide (ITO) is used as a material of the transparent electrode layer 6.

The organic layer 7 only needs to include at least the light-emitting layer. The organic layer 7 may be a single layer of only the light-emitting layer or a multilayer in which the light-emitting layer and at least one selected from the group including a hole injection layer, a hole transport layer, a hole injection and transport layer, a hole blocking layer, an electron injection layer, an electron transport layer, and an electron blocking layer are stacked. The light-emitting layer may have a multilayer structure. A known organic light-emitting material such as $Alq_3$ or DCM is used as a material of the light-emitting layer. The light-emitting layer to be used has a structure for providing light of a single color such as red, green, blue, or yellow or a structure for providing emitted light of a color obtained from a combination of those colors, such as white emitted light. Each of the hole injection layer, the hole transport layer, the hole injection and transport layer, the hole blocking layer, the electron injection layer, the electron transport layer, the electron blocking layer, and the like is made of a known material as appropriate.

In the first embodiment of the present invention, the five layers in total, that is, the hole transport layer, a red light-emitting layer, a blue light-emitting layer, a green light-emitting layer, and the electron transport layer are stacked above the transparent electrode layer 6, thereby constructing the organic layer 7 so as to collectively emit white light.

The reflection electrode layer 8 only needs to serve as an electrode and be reflective to at least light to be extracted. For example, Al, Cr, Mo, Ag, an Al alloy, an Al/Mo stacked material, or the like can be used as the reflection electrode layer 8. An electron injection layer made of an inorganic material such as LiF can be also provided as appropriate between the reflection electrode layer 8 and the organic layer 7.

The insulating layer 10 only needs to be made of a material having an insulating property. For example, a polyimide resin, an acrylic resin, or the like can be used.

Silicon nitride, silicon oxynitride, silicon oxide, or the like is used for the sealing film 11.

In the organic EL device, a surface of the transparent substrate 5 which is opposed to a surface thereof on which the transparent electrode layer 6 is formed is a light exit surface. That is, light emitted from the organic layer 7 is directly incident on the transparent electrode layer 6 or incident on the transparent electrode layer 6 after the light is reflected on the reflection electrode layer 8, and then exits through the transparent substrate 5.

Figure 3:
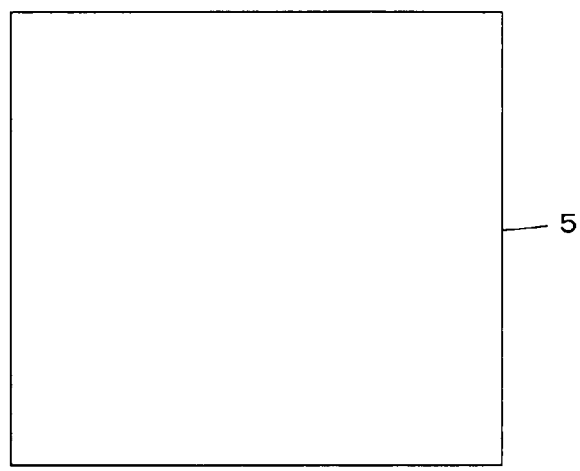
FIG. 3 is a plan view showing a transparent substrate used for a method of manufacturing the organic EL device according to the first embodiment of the present invention.
Figure 4:
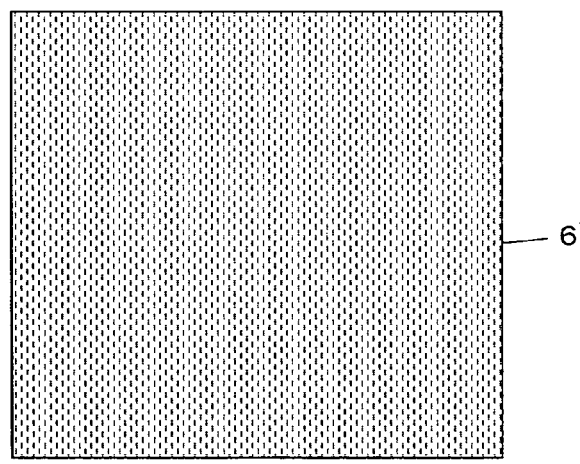
FIG. 4 is a plan view showing a step of forming a transparent electrode layer in the first embodiment.

Next, a method of manufacturing the organic EL device according to the first embodiment of the present invention will be described. First, the transparent substrate 5 as shown in FIG. 3 is prepared. Then, as shown in FIG. 4, the transparent electrode layer 6 is formed on the entire surface of the transparent substrate 5 by a known thin film forming method such as a sputtering method or a vacuum vapor deposition method.

Figure 5:
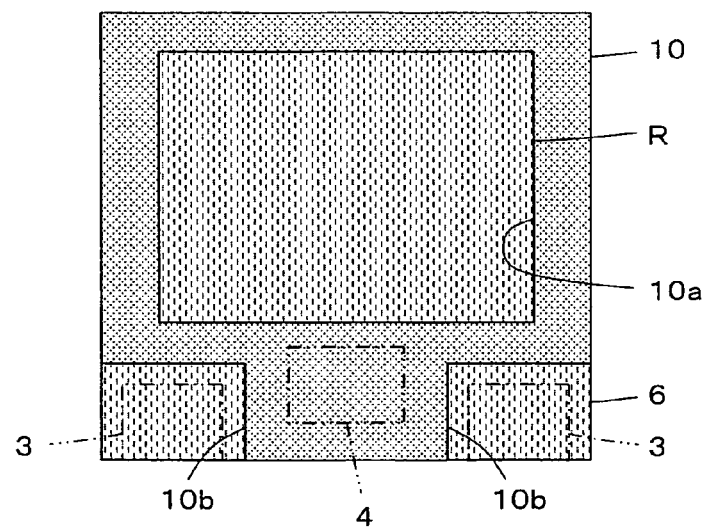
FIG. 5 is a plan view showing a step of forming an insulating layer in the first embodiment.

Then, as shown in FIG. 5, the insulating layer 10 having a first pattern for exposing the light-emitting region R and the first terminal portions 3 and covering the second terminal portion 4, that is, the insulating layer 10 having the opening portion 10a corresponding to the light-emitting region R and the cutting portions 10b corresponding to the first terminal portions 3 is formed on the surface of the transparent electrode layer 6. At this time, the insulating layer 10 having the first pattern is formed as follows. An insulating layer is formed on the entire surface of the transparent electrode layer 6 by a known thin film forming method such as a coating method. After that, the first pattern is transferred to the insulating layer using a photo mask or the like (exposure is performed). Then, the insulating layer other than a portion thereof corresponding to the first pattern is removed (development is performed).

Figure 6:
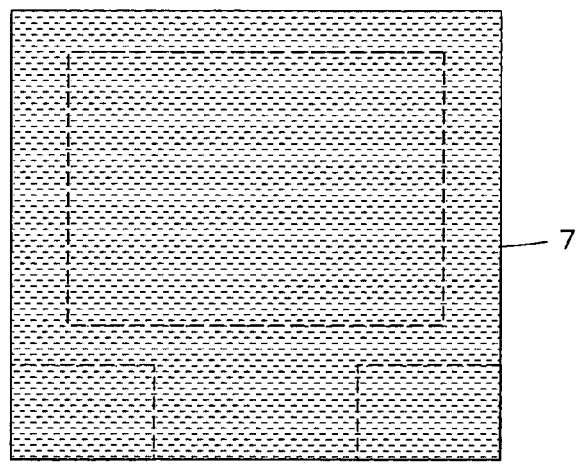
FIG. 6 is a plan view showing a step of forming an organic layer in the first embodiment.

After the insulating layer 10 is formed on the transparent electrode layer 6 as described above, as shown in FIG. 6, the organic layer 7 composed of the five layers including the light-emitting layer is formed on the entire surface of the transparent electrode layer 6 and the insulating layer 10 by a known thin film forming method such as a vacuum vapor deposition method.

Figure 7:
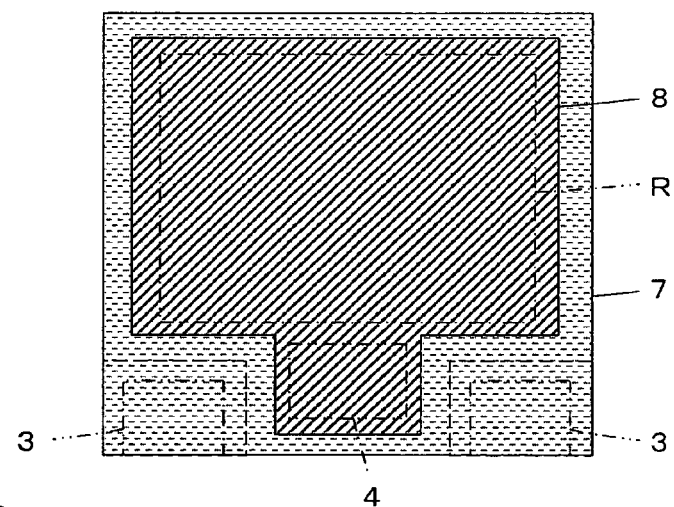
FIG. 7 is a plan view showing a step of forming a reflection electrode layer in the first embodiment.

As shown in FIG. 7, the reflection electrode layer 8 having a second pattern for covering the light-emitting region R and the second terminal portion 4 and exposing the first terminal portions 3 is formed on the organic layer 7. At this time, the reflection electrode layer 8 can be formed by a known thin film forming method such as a vacuum vapor deposition method using a mask (not shown) having an opening shape corresponding to the second pattern.

Figure 8:
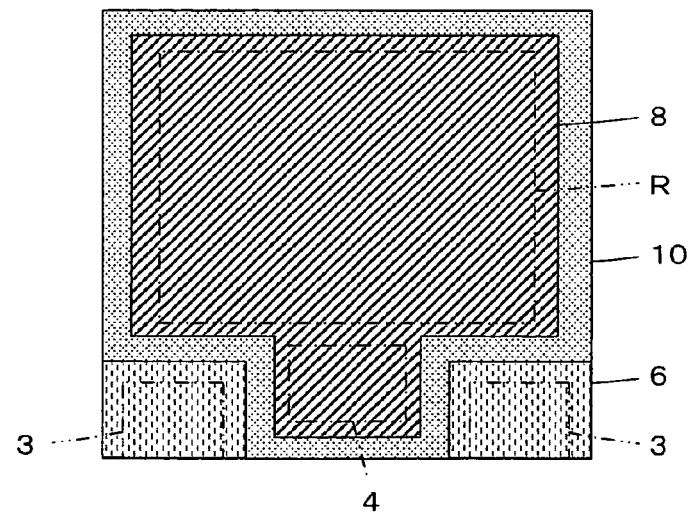
FIG. 8 is a plan view showing a step of exposing a first terminal portion in the first embodiment.

Then, a region of the organic layer 7 which is exposed without the reflection electrode layer 8 formed thereon is removed by dry etching. Therefore, as shown in FIG. 8, regions of the transparent electrode layer 6 in the first terminal portions 3 are exposed, respectively. At this time, dry etching can be performed using the reflection electrode layer 8 having the second pattern as a mask.

Figure 9:
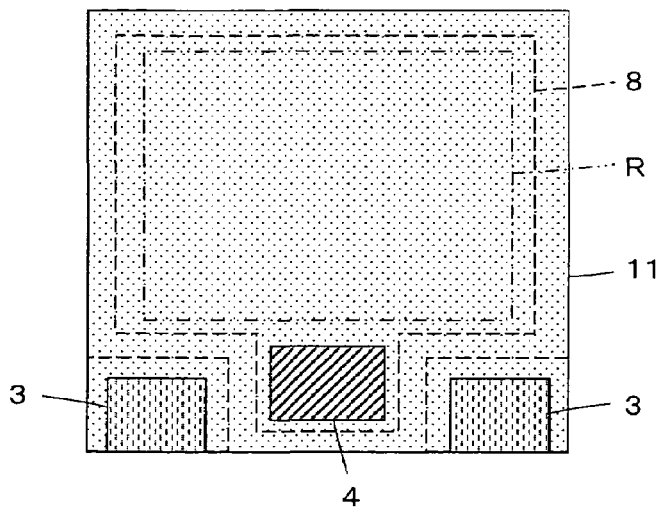
FIG. 9 is a plan view showing a step of forming a sealing film in the first embodiment.

Finally, as shown in FIG. 9, the sealing film 11 having a third pattern for covering the light-emitting region R and exposing the first terminal portions 3 and the second terminal portion 4 is formed, so that only the first terminal portions 3 and the second terminal portion 4 are exposed and the other portions are sealed. At this time, the sealing film 11 can be formed by a plasma CVD method or the like using a mask (not shown) having an opening shape corresponding to the third pattern.

Therefore, the organic EL device shown in FIG. 1 can be obtained.

As described above, when the organic EL device is manufactured by the method according to the first embodiment of the present invention, the first terminal portions 3 and the second terminal portion 4 can be formed simultaneously with the light-emitting region R. Therefore, the organic EL device including the first terminal portions 3 and the second terminal portion 4 can be easily manufactured.

The organic layer 7 is formed without using a mask or the like over the entire surface of the transparent electrode layer 6 on which the insulating layer 10 is formed, so it is unnecessary to align the mask with the transparent substrate 5, thereby easily forming the organic layer 7. Therefore, when the organic layer 7 has a multilayer structure, the organic layer 7 can be more easily formed. This reason will be described in more detail. When an organic EL device having a function equivalent to that of the organic EL device according to the first embodiment of the present invention is to be manufactured by a conventional manufacturing method, a mask is required to form each of the transparent electrode layer, the organic layer composed of the five layers, the reflection electrode layer, and the sealing film. Therefore, mask attachments are performed eight times as a whole. Then, it is necessary to align each mask with the substrate for every time of mask attachment, so that it takes time to manufacture the organic EL device.

In contrast, the uses of masks in the first embodiment are only three times. In other words, a mask is used to form each of the insulating layer 10, the reflection electrode layer 8, and the sealing film 11. Therefore, the number of alignments of masks can be significantly reduced, so it is possible to shorten a manufacturing time and simplify a manufacturing apparatus.

In the organic EL device manufactured by the above-mentioned method, as shown in FIG. 2A, each of the first terminal portions 3 has the structure in which the transparent electrode layer 6 is formed on the transparent substrate 5 and exposed. In addition, as shown in FIG. 2B, the second terminal portion 4 has the structure in which the transparent electrode layer 6, the insulating layer 10, the organic layer 7, and the reflection electrode layer 8 are formed in this order on the transparent substrate 5 and the reflection electrode layer 8 is exposed.

It is unnecessary to form the transparent electrode layer 6 on the transparent substrate 5 during a process of manufacturing the organic EL device. The transparent electrode layer 6 may be formed in advance in another process. Alternatively, the transparent substrate 5 on which the transparent electrode layer 6 is formed may be purchased for use.

Reactive ion etching can be used as the dry etching method of removing the exposed organic layer 7. An etching gas used at this time is a gas capable of suitably etching the organic layer. For example, an $O_2$ gas is used as the etching gas.

Second Embodiment

Figure 10:
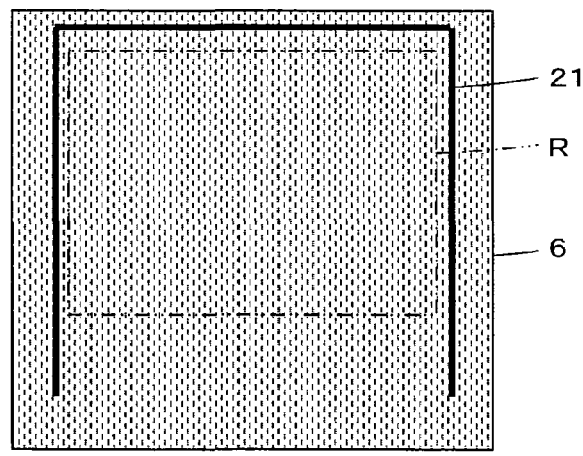
FIG. 10 is a plan view showing a step of forming an auxiliary electrode in a second embodiment.
Figure 11:
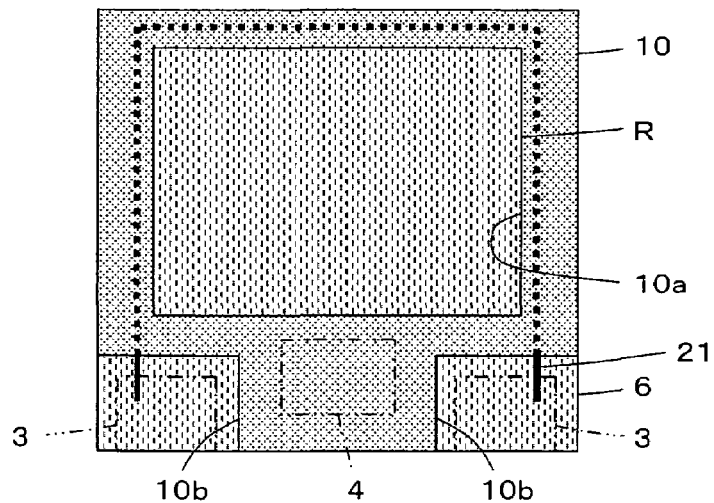
FIG. 11 is a plan view showing a step of forming an insulating layer in the second embodiment.

A method of manufacturing the organic EL device according to a second embodiment of the present invention will be described with reference to FIG. 10. The second embodiment describes a method of forming an auxiliary electrode 21 on the transparent electrode layer 6 before the formation of the insulating layer 10 by the method described in the first embodiment. That is, the auxiliary electrode 21 having a fourth pattern surrounding a circumference of the light-emitting region R is formed on the surface of the transparent electrode layer 6 formed on the entire surface of the transparent substrate 5. After that, as shown in FIG. 11, the insulating layer 10 having the first pattern is formed over the transparent electrode layer 6 on which the auxiliary electrode 21 is formed. At this time, only a portion of the auxiliary electrode 21 which is provided around at least the light-emitting region needs to be covered with the insulating layer 10. Portions of the auxiliary electrode 21 may be located on regions of the transparent electrode layer 6 in the first terminal portions 3 to be exposed through the respective cutting portions 10b of the insulating layer 10. Then, the organic layer 7, the reflection electrode layer 8, and the sealing film 11 may be formed as in the first embodiment.

The auxiliary electrode 21 is made of a material having conductivity superior to that of the transparent electrode layer 6, such as Cu or Al, and electrically connected with the transparent electrode layer 6.

The auxiliary electrode 21 can be formed by a thin film forming method such as a vacuum vapor deposition method using a mask having an opening shape corresponding to the fourth pattern. Alternatively, the auxiliary electrode 21 having the fourth pattern can be formed as follows. An auxiliary electrode layer is formed on the entire surface of the transparent electrode layer 6 by a known thin film forming method such as a sputtering method or a vacuum vapor deposition method. After that, an unnecessary portion of the auxiliary electrode layer is removed by wet etching, dry etching, or the like. It is also possible to use a transparent substrate in which two layers, that is, the transparent electrode layer 6 and the auxiliary electrode 21 are stacked in this order on the entire surface thereof in advance.

Even in the above-mentioned case, the organic EL device including the first terminal portions 3 and the second terminal portion 4 can be easily manufactured as in above-mentioned first embodiment.

In addition, the auxiliary electrode 21 is formed on the transparent electrode layer 6 in the second embodiment. Therefore, luminance unevenness caused by voltage drop in the in-plane direction of the transparent electrode layer 6 can be reduced.

In the first embodiment and the second embodiment described above, the insulating layer is formed on the entire surface of the transparent electrode layer 6 by a coating method and then exposure and development are performed to form the insulating layer 10 having the first pattern. However, depending on a material to be used for the insulating layer 10, the insulating layer 10 having the first pattern can be formed by a known thin film forming method such as a sputtering method or a vacuum vapor deposition method using the mask having the opening shape corresponding to the first pattern.

The sealing film 11 having the third pattern can be formed by a printing method of printing the sealing film 11 in which the third pattern is formed in advance instead of forming using the mask.

The sealing film 11 having the third pattern can be obtained as follows. Masking tapes are placed on the first terminal portions 3 and the second terminal portion 4, respectively. With such a state, a sealing film for entirely covering the transparent electrode layer 6, the insulating layer 10, the organic layer 7, and the reflection electrode layer 8 which are located above the transparent substrate 5 is formed by a plasma CVD method or the like. After that, the masking tapes placed on the first terminal portions 3 and the second terminal portion 4 are peeled.

The sealing film 11 having the third pattern can be also formed as follows. The sealing film for entirely covering the transparent electrode layer 6, the insulating layer 10, the organic layer 7, and the reflection electrode layer 8 which are located above the transparent substrate 5 is formed by a plasma CVD method or the like. After that, a solder resist having the third pattern is provided on the sealing film by a printing method, a known lithography technique, or the like. Dry etching is performed using the solder resist as a mask. In this case, the solder resist has a function for protecting the organic EL device from physical damage without being peeled.

In the first embodiment and the second embodiment described above, the transparent electrode layer 6 is formed on the entire surface of the transparent substrate 5. The transparent electrode layer 6 having a predetermined pattern such as a pattern for exposing a peripheral portion of the transparent substrate 5 may be formed.

The reflection electrode layer 8 may be formed of a plurality of conductive layers which are stacked on one another. In this time, a material of each of the layers can be selected as appropriate to form the reflection electrode layer 8 having both excellent conductivity and excellent reflectivity. When a layer of the conductive layers which is located on a surface opposed to the organic layer 7 is made of a material whose ionization tendency is small, the reflection electrode layer 8 can be prevented from oxidizing in the case where the organic layer 7 is removed by reactive ion etching using, for example, an $O_2$ gas.

The organic EL device described in each of the first embodiment and the second embodiment is a bottom emission organic EL device in which the transparent electrode layer 6, the organic layer 7, and the reflection electrode layer 8 are stacked in this order on the transparent substrate 5 and light emitted from the organic layer 7 exits through the transparent electrode layer 6 and the transparent substrate 5. The present invention is not limited thereto. The manufacturing method according to the present invention is applied even to a top emission organic EL device in which the reflection electrode layer serving as the first electrode layer, the organic layer, and the transparent electrode layer serving as the second electrode layer are stacked in this order on a substrate and light emitted from the organic layer exits through the transparent electrode layer opposite to the substrate. In this case, the sealing film is formed on the transparent electrode layer, and it is necessary that the sealing film be made of a material transparent or semitransparent to light to be extracted.

What is claimed is:

1. A method of manufacturing an organic EL device including a light-emitting region, a first terminal portion, and a second terminal portion, comprising the steps of:
   preparing a substrate on which a first electrode layer is formed;
   forming, on the first electrode layer, an insulating layer having a first pattern for covering the second terminal portion and exposing the light-emitting region and the first terminal portion;
   forming an organic layer above an entire surface of the substrate on which the first electrode layer and the insulating layer are formed;
   forming, on the organic layer, a second electrode layer having a second pattern for covering the light-emitting region and the second terminal portion and exposing the first terminal portion;
   removing a region of the organic layer on which the second electrode layer is not formed to expose a region of the first electrode layer in the first terminal portion; and
   forming, on the second electrode layer, a sealing film having a third pattern for covering the light-emitting region and exposing the first terminal portion and the second terminal portion.

2. A method of manufacturing an organic EL device according to claim 1, further comprising the steps of:
   forming an auxiliary electrode on the first electrode layer before the insulating layer is formed; and
   forming the insulating layer, above the substrate on which the first electrode layer and the auxiliary electrode are formed, so as to cover at least a portion of the auxiliary electrode.

3. A method of manufacturing an organic EL device according to claim 1, wherein the insulating layer having the first pattern is formed using a mask corresponding to the first pattern.

4. A method of manufacturing an organic EL device according to claim 1, wherein the insulating layer having the first pattern is formed by forming the insulating layer above an entire surface of the substrate and then removing portions of the insulating layer which are formed in the first terminal portion and the light-emitting region.

5. A method of manufacturing an organic EL device according to claim 1, wherein the second electrode layer having the second pattern is formed using a mask corresponding to the second pattern.

6. A method of manufacturing an organic EL device according to claim 1, wherein the second electrode layer is formed by stacking a plurality of conductive layers.

7. A method of manufacturing an organic EL device according to claim 6, wherein a layer of the plurality of conductive layers which is located on a surface opposite to the organic layer is made of a material whose ionization tendency is small.

8. A method of manufacturing an organic EL device according to claim 1, wherein the sealing film having the third pattern is formed using a mask corresponding to the third pattern.

9. A method of manufacturing an organic EL device according to claim 1, wherein the sealing film having the third pattern is formed by forming a sealing film above the entire surface of the substrate while a masking tape is placed on the first terminal portion and the second terminal portion and then peeling the masking tape.

10. A method of manufacturing an organic EL device according to claim 1, wherein the region of the organic layer on which the second electrode layer is not formed is removed by a dry etching method to expose the region of the first electrode layer in the first terminal portion.

11. A method of manufacturing an organic EL device according to claim 10, wherein the dry etching method is performed using the second electrode layer as a mask.

* * * * *